(12) United States Patent
Büker et al.

(10) Patent No.: US 10,516,298 B2
(45) Date of Patent: Dec. 24, 2019

(54) METHOD FOR INDUCTIVE CURRENT TRANSMISSION

(71) Applicant: WiTech GmbH, Bielefeld (DE)

(72) Inventors: Maik-Julian Büker, Paderborn (DE); Jörg Rainer Euskirchen, Bielefeld (DE); Marco Schmidt, Paderborn (DE)

(73) Assignee: WiTech GmbH, Bielefeld (DE)

( * ) Notice: Subject to any disclaimer, the term of this patent is extended or adjusted under 35 U.S.C. 154(b) by 154 days.

(21) Appl. No.: 15/555,691

(22) PCT Filed: Mar. 2, 2016

(86) PCT No.: PCT/DE2016/000093
§ 371 (c)(1),
(2) Date: Sep. 5, 2017

(87) PCT Pub. No.: WO2016/138887
PCT Pub. Date: Sep. 9, 2016

(65) Prior Publication Data
US 2018/0048186 A1    Feb. 15, 2018

(30) Foreign Application Priority Data
Mar. 4, 2015  (DE) .................. 10 2015 002 687

(51) Int. Cl.
*H02J 50/12* (2016.01)
*H04B 5/00* (2006.01)
*H03F 3/217* (2006.01)

(52) U.S. Cl.
CPC ............ *H02J 50/12* (2016.02); *H03F 3/2173* (2013.01); *H03F 3/2176* (2013.01); *H04B 5/0037* (2013.01)

(58) Field of Classification Search
CPC ...... H04B 5/0037; H02J 50/12; H03F 3/2176; H03F 3/2173
See application file for complete search history.

(56) References Cited

U.S. PATENT DOCUMENTS

| | | |
|---|---|---|
| 2013/0033118 A1 | 2/2013 | Karalis et al. |
| 2013/0229829 A1* | 9/2013 | Zhang ............... H02M 3/33546 363/16 |
| 2014/0268891 A1* | 9/2014 | Sigamani .............. H02M 3/285 363/17 |

(Continued)

FOREIGN PATENT DOCUMENTS

| | | |
|---|---|---|
| DE | 10 2010 047 579 A1 | 4/2012 |
| EP | 1 318 260 A2 | 6/2003 |

OTHER PUBLICATIONS

International Preliminary Report on Patentability corresponding to PCT/DE2016/000093 dated Sep. 5, 2017.

(Continued)

*Primary Examiner* — Alfonso Perez Borroto
*Assistant Examiner* — Esayas G Yeshaw
(74) *Attorney, Agent, or Firm* — Jenkins, Wilson, Taylor & Hunt, P.A.

(57) ABSTRACT

The invention relates to a method of inductive current transmission via at least one transmission coil subjected with electrical power by an amplifier, wherein the amplifier is operated in a zero voltage switching (ZVC) and zero current switching (ZCV) mode.

9 Claims, 3 Drawing Sheets

(56) References Cited

U.S. PATENT DOCUMENTS

Figure 1:
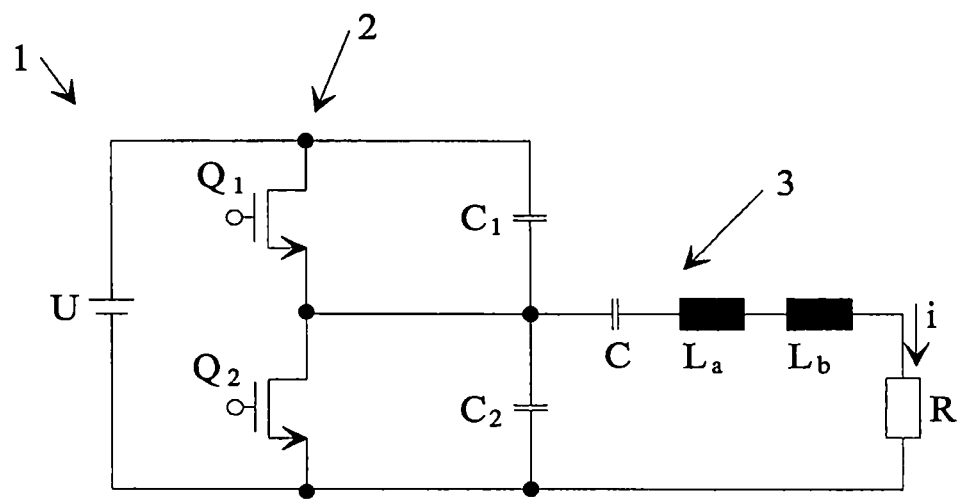

| | | | |
|---|---|---|---|
| 2016/0175024 A1* | 6/2016 | Yates | H03F 3/193 606/34 |
| 2016/0181927 A1* | 6/2016 | Chang | H02M 1/42 363/21.02 |

OTHER PUBLICATIONS

International Search Report and Written Opinion of the International Searching Authority corresponding to PCT/DE2016/000093 dated Jul. 18, 2016.

* cited by examiner

METHOD FOR INDUCTIVE CURRENT TRANSMISSION

The invention relates to a method of inductive current transmission via at least one transmission coil subjected with electrical power by an amplifier.

Inductive current transmission for, for example, the charging of accumulators for the supply of electrical devices is widely known. Thus, EP 1 318 260 A2 discloses wireless current transmission from a fixed network to an accumulator moved along with a door leaf.

A further application is disclosed in DE 10 2010 047 579 A1. In this case, a furniture component extending in a laminar manner, for example a tabletop or a worktop, is disclosed, in which a multitude of transmitter coils are integrated for inductive current transmission for an electrically operated device such as, in particular, a laptop, a smartphone, a tablet or the like.

The aim is that an electrical load which is placed anywhere on the furniture component receives current supply.

Such electrical loads can be divided into different power classes of current consumption. In order to ensure optimum current supply for such different loads, transmission of different powers is required also. Therefore, an amplifier impinging the at least one transmitter coil with electrical power has to be designed very efficiently and with low interference. This applies, in particular, also at a high frequency range from about 500 kHz for wireless energy transmission.

This technical problem is solved by a method of inductive current transmission via at least one transmission coil impinged with electrical power by an amplifier according to the feature of claim 1 by the measure that the amplifier is operated in a zero voltage switching (ZVC) and zero current switching (ZCV) mode.

By switching electronic switches such as transistors of the amplifier in the zero crossing of the voltage and in the zero crossing of the current, power dissipations of the electronic switches are minimized and disruptions are largely avoided, thus ensuring safe, stable operation even at high frequencies.

However, only few switching modes are suitable to meet both conditions at the same time. This is possible with a class D amplifier, being readjusted by a sequence control and is, as it were, an amplifier of class DE.

Such sequence control may be formed as independent, freely programmable logic unit or by an ASIC, an application-specific integrated circuit.

In a constructive embodiment of the method according to the invention, it is provided that the amplifier comprises a half bride having two electronic switches, a series resonant circuit and two capacities allocated to the electronic switches, that the sequence control generates two square-wave signals being phase-shifted by a half period for controlling the electronic switches, the pulse width of the switches is dimensioned such that a discharging capacity is discharged exactly when the following square-wave signal is present.

The capacities may be formed by suitable capacitors connected in parallel to the switches, by switch capacities themselves or appropriate combinations.

The pulse width modulation is not intended for power control, as is usually the case with class D amplifiers, but for tuning of the amplifier mode of class DE, zero voltage switching and zero current switching. In this context, it is also provided that the sequence control generates pulses of fixed frequency as square-wave signals which may assume two values. However, it is also provided that the sequence control generates pulses of presetable pulse widths as square-wave signals. Thereby, in combination of these last-mentioned features, the distance between two rising edges of successive pulses is always the same. Merely the pulse width changes.

This pulse width modulation is not intended for adjustment of amplifier power, but is intended for operation of the amplifier in the stated modes. For power control it is provided that the square-wave signals are divided into equally spaced intervals and that, for power control of the amplifier, the sequence control generates a presetable number of pulses in the interval, a thinning out.

If no pulses are transmitted, the signal remains zero and no energy is transmitted.

For a clear switching of the electronic switches, it may further be provided that, for a swing-out of the half bridge, the half bridge is short-circuited one-sidedly, which in principle represents a forced switch-off.

In order to ensure optimum operation of the transmitter for inductive power transmission, a control loop is further provided between pulse-generating sequence control and half bridge. As a result, it is possible that the pulse widths are adjusted via evaluated signals of the half bridge such that the half bridge is also operated optimally. A microcontroller, from which the sequence control receives information via a data bus, is appropriate for this purpose. Moreover, this information may contain data for power control of the amplifier so that optimum wireless energy transmission is also possible for devices of different power classes.

As a whole, it has proved to be appropriate if the sequence control is a complex programmable logic device (CPLD), a programmable logic unit. In contrast to a field programmable gate array (FPGA), a CPLD does not lose its programming in the event of a loss of the supply voltage since it is based on EEPROM technology. As an alternative, an integrated application-specific circuit is available for the sequence control.

Figure 5:
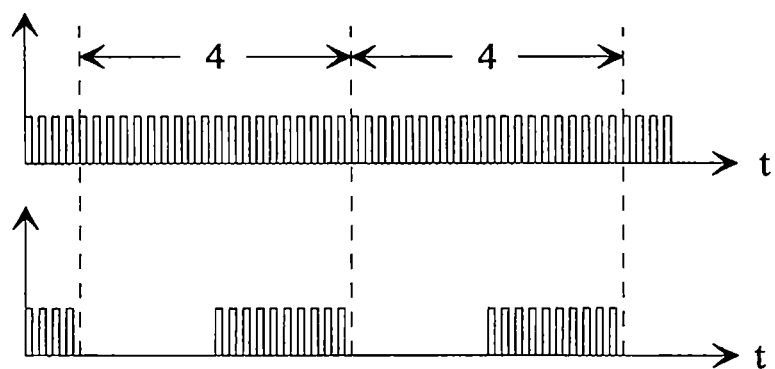
Figure 4:
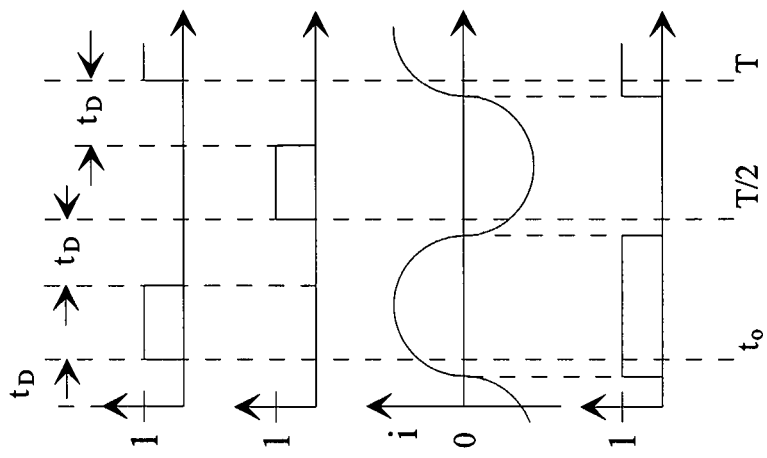
Figure 3:
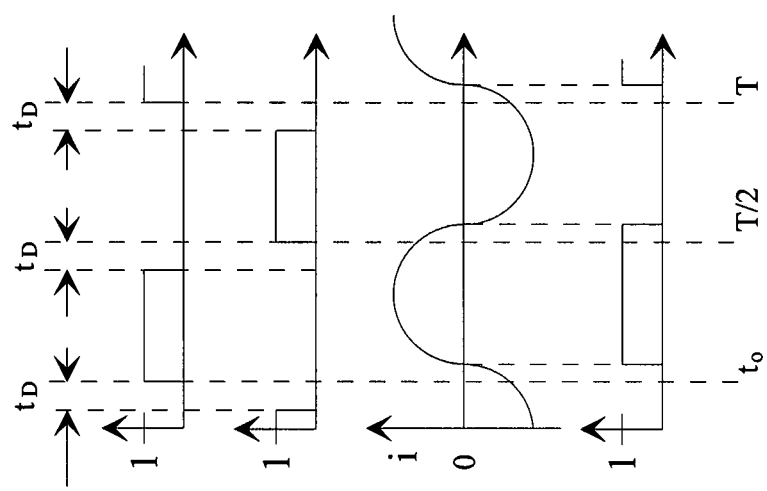
Figure 2:
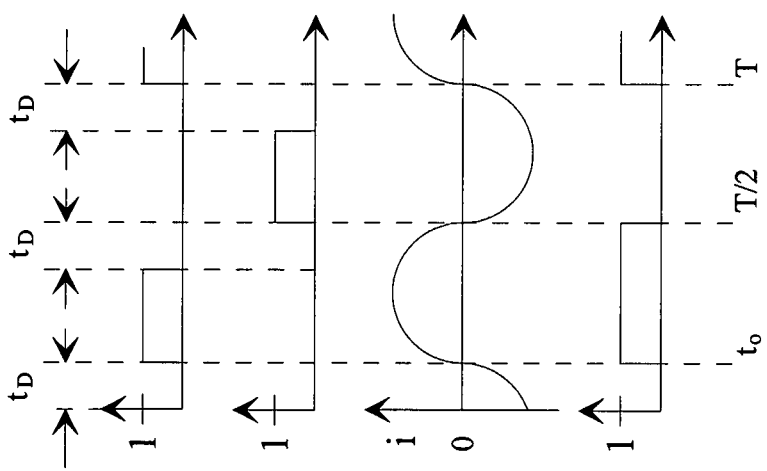
Figure 6:
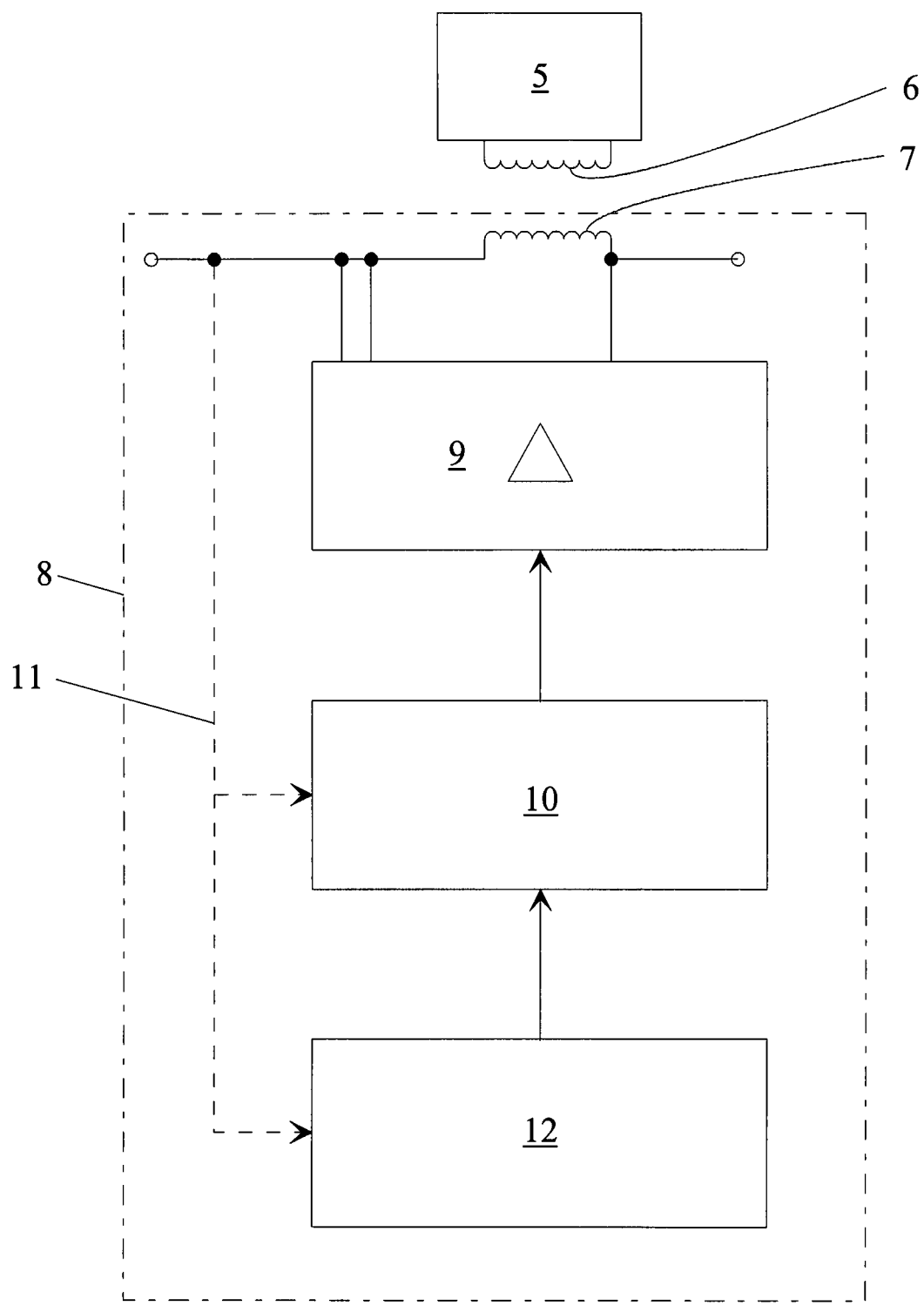

The essence of the invention is illustrated in more detail via the drawing in which only schematic and exemplary representations are given. In the drawing shows:

FIG. 1: circuit of an inverter as amplifier,
FIG. 2: an optimum pulse width adjustment,
FIG. 3: a pulse width adjustment which is too large,
FIG. 4: a pulse width adjustment which is too small,
FIG. 5: the thinning out, and
FIG. 6: a simplified block diagram for the wireless energy transmission according to the invention.

FIG. 1 shows the formation of an amplifier 1 for the implementation of the method according to the invention as an inverter with a half bridge 2 having two electronic switches $Q_1$, $Q_2$ for example transistors.

A series resonant circuit 3 with the capacity C and the inductivity $L_a$ is connected in the load circuit of the two electronic switches $Q_1$, $Q_2$. A further inductivity $L_b$ being connected in series with the series resonant circuit 3 with the inductivity $L_a$ forms the transmitting coil. The load circuit is closed via an ohmic resistor R.

Two capacities $C_1$, $C_2$ are connected in parallel to the electronic switches $Q_1$, $Q_2$.

Depending on the switch position of the electronic switches $Q_1$, $Q_2$, one of the two capacities $C_1$, $C_2$ is charged with the supply voltage U or discharged via the load circuit, respectively.

For operation of the amplifier 1, square-wave signals of the same frequency being phase-shifted by a half period are required at the electronic switches $Q_1$, $Q_2$. As a result, an alternating current occurs at the inductivities $L_a$ and $L_b$.

For the highest possible efficiency of the inductive energy transmission, the electronic switches $Q_1$, $Q_2$ have to be controlled with optimally coordinated square-wave signals. The pulse width has to be just as large that capacities $C_1$, $C_2$ can discharge through the inductive effect of the load circuit within the discharge time $t_D$. One of the capacities $C_1$, $C_2$ should be discharged exactly when one pulse drives the other electronic switch $Q_2$, $A_1$ and starts charging the second capacity $C_2$, $C_1$. This is the case if a pulse exactly arrives at an electronic switch $Q_1$, $Q_2$ when the voltage or the current, respectively, is zero, whereby the amplifier is operated in a zero voltage switching and zero current switching mode.

FIG. 2 shows in the two upper coordinate systems the square-wave signals beeing phase-shifted by a half period T/2, here normalised to one. The pulse width of the two square-wave signals is optimal so that the current i is switched by the electronic switches $Q_1$ or $Q_2$, respectively, in the zero crossing. The zero crossing signal, represented normalised in the lowest coordinate system, starts with the edge rise of the first square-wave signal and ends with the edge rise of the second square-wave signal. The distance between the falling edge of the first square-wave signal up to the rising edge of the second square-wave signal or between the falling edge og the second square wave signal up to the rising edge of the third square-wave signal corresponds to the discharge time $t_D$.

In FIG. 3, the pulse width is shown too large. Correspondingly, the zero crossing of the current i appears too late or, in FIG. 4 with a pulse width which is too small, it appears too early. Since, in these two cases, the switch-on times of the square-wave signals do not match with the zero crossing of the current i, the effectiveness of the circuit is significantly reduced.

For modulation of the optimal pulse width, a sequence control is provided, for example a complex programmable logic device, CLPD or an ASIC. This pulse width modulation with pulses of fixed frequency, but presetable pulse widths, is not intended for adjustment of the power delivered by the amplifier 1, but exclusively for optimal operation, exact switching of the electronic switches $Q_1$, $Q_2$.

However, the adjustment of the inductively transmitted power is also effected by the sequence control. Normally, the sequence control generates a presetable number of pulses in an interval 4, for example 20 impulses in FIG. 5, upper coordinate system. However, for a reduction of the inductively transmitted power, these 20 pulses are not generated, but less, for example only 10 in FIG. 5, lower coordinate system.

In this context, the two electronic switches $Q_1$, $Q_2$ are to be connected such that no inductive energy transmission takes places during the time in which no pulses are transmitted.

FIG. 6 shows, in a simplified manner, the master plan of the method according to the invention. A load 5 is coupled via a receiver coil 6 to a transmitter coil 7 of a transmitter 8 for inductive current transmission. The transmitter coil 7 is loaded by an amplifier 9 as explained above. The sequence control 9, which presets the switching behavior of the amplifier 9, receives the necessary information for adjustment of the pulse width via a control loop 11, indicated as a dot-dash line, for example as a phase signal directly from the circuit or via a microcontroller 12. The microcontroller 12 may transmit further information to the sequence control 10, for example concerning the power class of the load 5, for a power control of the amplifier 9. Optimum operation of the amplifier 9 as well as optimum power control of the amplifier 9 to the load 5 are thus ensured.

The invention claimed is:

1. A method of inductive current transmission via at least one transmission coil subjected with electrical power by an amplifier, wherein the amplifier is operated in a zero voltage switching (ZVC) and zero current switching (ZCV) mode, wherein the amplifier is a class D amplifier, being readjusted by a sequence control, wherein the amplifier comprises a half bridge having two electronic switches, a series resonant circuit and two capacities allocated to the electronic switches, and further wherein the sequence control generates two square-wave signals that are phase-shifted by a half period for controlling the electronic switches and the pulse width is dimensioned such that a discharging capacity is discharged exactly when the following square-wave signal is present, and wherein, for a swing-out of the half bridge, the half bridge is short-circuited one-sidedly.

2. The method according to claim 1, wherein the sequence control generates pulses of fixed frequency as square-wave signals.

3. The method according to claim 2, wherein a presetable number of pulses is divided into equally spaced intervals and that, for power control of the amplifier, the sequence control generates a lower number of pulses than the preset number of pulses in the interval.

4. The method according to claim 2, wherein the sequence control generates pulses of presetable pulse widths as square-wave signals.

5. The method according to claim 1, wherein the sequence control generates pulses of presetable pulse widths as square-wave signals.

6. The method according to claim 5, wherein a presetable number of pulses is divided into equally spaced intervals and that, for power control of the amplifier, the sequence control generates a lower number of pulses than the preset number of pulses in the interval.

7. The method according to claim 1, further comprising a control loop between the pulse-generating sequence control and the half bridge.

8. The method according to claim 7, wherein the sequence control receives, via a data bus, information for an adjustment of power from a microcontroller.

9. The method according to claim 1, wherein the sequence control is a complex programmable logic device (CPLD) or an ASIC.

* * * * *